(12) United States Patent
May et al.

(10) Patent No.: US 9,087,945 B2
(45) Date of Patent: Jul. 21, 2015

(54) NANOWIRES, NANOWIRE JUNCTIONS, AND METHODS OF MAKING THE SAME

(75) Inventors: Charles Elijah May, Lexington, KY (US); Vijay Pal Singh, Lexington, KY (US); Suresh K S Rajaputra, Lexington, KY (US)

(73) Assignee: THE UNIVERSITY OF KENTUCKY RESEARCH FOUNDATION, Lexington, KY (US)

( * ) Notice: Subject to any disclaimer, the term of this patent is extended or adjusted under 35 U.S.C. 154(b) by 958 days.

(21) Appl. No.: 12/687,272

(22) Filed: Jan. 14, 2010

(65) Prior Publication Data

US 2010/0126568 A1 May 27, 2010

Related U.S. Application Data

(63) Continuation-in-part of application No. 11/471,409, filed on Jun. 20, 2006, now abandoned.

(51) Int. Cl.
*H01L 31/00* (2006.01)
*H01L 31/0352* (2006.01)
*C30B 29/48* (2006.01)
*C30B 29/60* (2006.01)

(52) U.S. Cl.
CPC ........ *H01L 31/035281* (2013.01); *C30B 29/48* (2013.01); *C30B 29/60* (2013.01); *Y02E 10/50* (2013.01)

(58) Field of Classification Search
USPC .............. 136/243–293; 205/59, 64, 122, 123; 438/57, 71; 977/893
See application file for complete search history.

(56) References Cited

U.S. PATENT DOCUMENTS

| | | | |
|---|---|---|---|
| 5,747,180 A * | 5/1998 | Miller et al. | 428/601 |
| 6,187,165 B1 | 2/2001 | Chien et al. | |
| 6,231,744 B1 | 5/2001 | Ying et al. | |
| 6,538,375 B1 * | 3/2003 | Duggal et al. | 313/506 |
| 7,112,525 B1 | 9/2006 | Bhansali et al. | |
| 7,267,859 B1 | 9/2007 | Rabin et al. | |
| 2004/0023471 A1 | 2/2004 | Adu et al. | |
| 2006/0234519 A1 | 10/2006 | Pan et al. | |
| 2007/0221917 A1 | 9/2007 | Chin et al. | |
| 2008/0182100 A1 | 7/2008 | Ng et al. | |
| 2008/0210662 A1 | 9/2008 | Rabin et al. | |
| 2008/0217181 A1 | 9/2008 | Hautier et al. | |
| 2008/0223445 A1 * | 9/2008 | Marks et al. | 136/263 |

FOREIGN PATENT DOCUMENTS

WO    WO 2010131245    * 11/2010    .............. H01L 31/00

\* cited by examiner

*Primary Examiner* — Thanh-Truc Trinh
(74) *Attorney, Agent, or Firm* — King & Schickli PLLC

(57) ABSTRACT

Disclosed is a nanostructure including a first set of nanowires formed from filling a plurality of voids of a template. The nanostructure also includes a second set of nanowires formed from filling a plurality of spaces created when the template is removed, such that the second set of nanowires encases the first set of nanowires. Several methods are also disclosed. In one embodiment, a method of fabricating a nanostructure including nanowires is disclosed. The method may include forming a first set of nanowires in a template, removing a first portion of the template, thereby creating spaces between the first set of nanowires, forming a second set of nanowires in the spaces between the first set of nanowires, and removing a second portion of the template.

3 Claims, 4 Drawing Sheets

NANOWIRES, NANOWIRE JUNCTIONS, AND METHODS OF MAKING THE SAME

This application is a continuation-in-part of prior U.S. patent application Ser. No. 11/471,409, filed Jun. 20, 2006 now abandoned, the entirety of which is herein incorporated by reference.

TECHNICAL FIELD

The present invention generally relates to nanowires and, more particularly, to a nanostructure with ordered nanowires and methods of making the same.

BACKGROUND OF THE INVENTION

In recent times, nanostructures have been considered for use in various electronic and other applications. For instance, the use of nanowires has been considered for fabricating solar cells, sensors, and other solid state devices. Although the use of nanowires provides benefits for these devices, such as increase in efficiency, the nanoscale of the devices creates issues that prevent large-scale manufacture. In particular, large-scale manufacture has been prevented by an inability to create an end product that allows for a predictable and/or desirable orientation of nanowires.

Accordingly, needs exist in the art for a nanostructure having a controlled orientation of the nanowires and a method of forming the same.

SUMMARY OF THE INVENTION

In accordance with the purposes of the present invention as described herein, a new and improved nanostructure and methods are disclosed. One embodiment of the method of fabricating a nanostructure including nanowires includes forming a first set of nanowires in a template. The method also requires removing a first portion of the template, thereby creating spaces between the first set of nanowires. Furthermore, the method includes forming a second set of nanowires in the spaces between the first set of nanowires; and removing a second portion of the template.

The forming of the first set of nanowires may include growing the first set of nanowires by vertically filling portions of voids of the template with an n-type material. The template may comprise a nanoporous anodized aluminum oxide template. In one embodiment, the removing of the first portion of the template does not remove the first set of nanowires. The removing of the second portion of the template may result in the nanostructure being free of any template. The template may include a honeycomb pattern having alternating voids and alumina material.

In another embodiment, the method of fabricating a nanostructure including nanowires, includes forming a template having a plurality of voids, forming a first set of nanowires in the voids of the template, removing a portion of the template, thereby exposing at least a portion of the first set of nanowires and forming a plurality of spaces between the nanowires in the first set of nanowires, forming a second set of nanowires in the plurality of spaces, and removing the remainder of the template.

In one embodiment, the forming of the first set of nanowires includes growing the first set of nanowires by vertically filling portions of voids of the template with an n-type material. The removing the remainder of the template may expose small protrusions of nanowires which can be individually contacted. The forming the first set of nanowires and forming the second set of nanowires may include electrochemical deposition. The material forming the first set of nanowires may be different from the material forming the second set of nanowires. The removing of the portion of the template may not remove the first set of nanowires. The material forming the second set of nanowires may be an insulator.

In one embodiment, the method of fabricating a nanostructure including nanowires, includes forming an $Al_2O_3$ template having a plurality of voids in a honeycomb pattern, placing the template in an electrochemical bath containing zinc and sulfur, forming a set of zinc sulfide nanowires in the voids of the template, placing the template in a chemical bath to remove at least a portion of the template without removing the zinc sulfide nanowires, placing the template in an electrochemical bath containing lithium and fluoride, encasing the set of zinc sulfide nanowires with lithium fluoride, and removing any remaining portion of the template.

The forming the set of zinc sulfide nanowires may include growing the zinc sulfide nanowires by vertically filling the plurality of voids of the template. The removing any remaining portion of the template may expose small protrusions of zinc sulfide nanowires which can be individually contacted.

In one embodiment, the nanostructure includes a first set of nanowires formed from filling a plurality of voids of a template, and a second set of nanowires formed from filling a plurality of spaces created when the template is removed, such that the second set of nanowires encases the first set of nanowires. The nanostructure may be a solar cell. In one embodiment, there are no horizontal junctions between the first and second set of nanowires.

BRIEF DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE INVENTION

In the following detailed description of the preferred embodiments, reference is made to the accompanying drawings that form a part hereof, and in which is shown by way of illustration, specific embodiments in which the invention may be practiced. These embodiments are described in sufficient detail to enable those skilled in the art to practice the invention and like numerals represent like details in the various figures. Also, it is to be understood that other embodiments may be utilized and that process, mechanical, electrical and/or other changes may be made without departing from the scope of the present invention. In accordance with the present invention, a nanostructure having nanowires embedded in various materials and a method of forming the same is hereinafter described.

Figure 1:
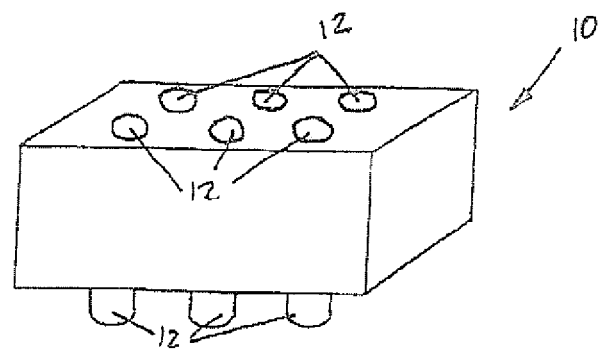
FIG. 1 is a perspective view of a workpiece in accordance with one possible aspect of the invention disclosed herein.
Figure 2:
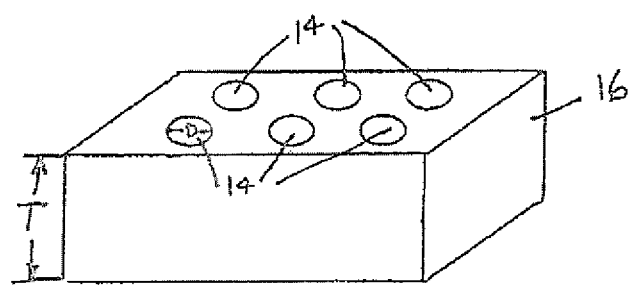
FIG. 2 is a perspective view of a template with pores or voids.

FIG. 1 shows one embodiment of a nanostructure 10 including embedded nanowires 12. As shown, the nanowires 12 are arranged in an orderly pattern, wherein they are substantially parallel to one another. With reference to FIGS. 2-6, the process steps for forming the nanostructure are generally described. FIG. 2 illustrates the beginning of the process by forming or growing a first set of nanowires 12. In one embodiment, the nanowires 12 are grown in the pores or voids 14 of a template 16, such as in a nanoporous anodized aluminum oxide (AAO) template. The AAO template 16 may be formed by any known method. One method for forming an AAO template and growing nanowires is disclosed in U.S. patent application Ser. No. 11/471,409, published as U.S. Pub. No. 20070289627 (the entirety of which is hereby incorporated by reference).

In one embodiment, the template 16 is a layer of alumina ($Al_2O_3$) uniformly ordered with pluralities of pores or voids 14 uniformly distributed over an area of about 25 $cm^2$. In fabrication, a relatively uniformly thick aluminum layer is sputtered or evaporated on the substrate and a current flow in a chemical bath of oxalic acid ($H_2C_2O_4$) is used to create the pores or voids 14. To achieve appropriate diameters and spacing of the pores or voids 14, various anodizing conditions have been developed and more are contemplated. In one example, a two step process includes: first, a 2 minute anodization in oxalic acid followed by a 2 minute etching in phosphoric acid; and second, application of current for about 25 minutes at a current density, in the chemical bath, of about 30 A/$m^2$ with voltages across electrodes in the bath at about a relatively constant 40 volts.

The template 16 may include a honeycomb pattern having alternating voids 14 and alumina material. It is relatively ordered and extends over an area of about 25 $cm^2$. Representatively, each void 14 has a diameter D of about 60 nanometers. The thickness T is about 4000 nanometers with material in the honeycomb being walled at about 10 to about 100 nanometers wide.

Figure 3:
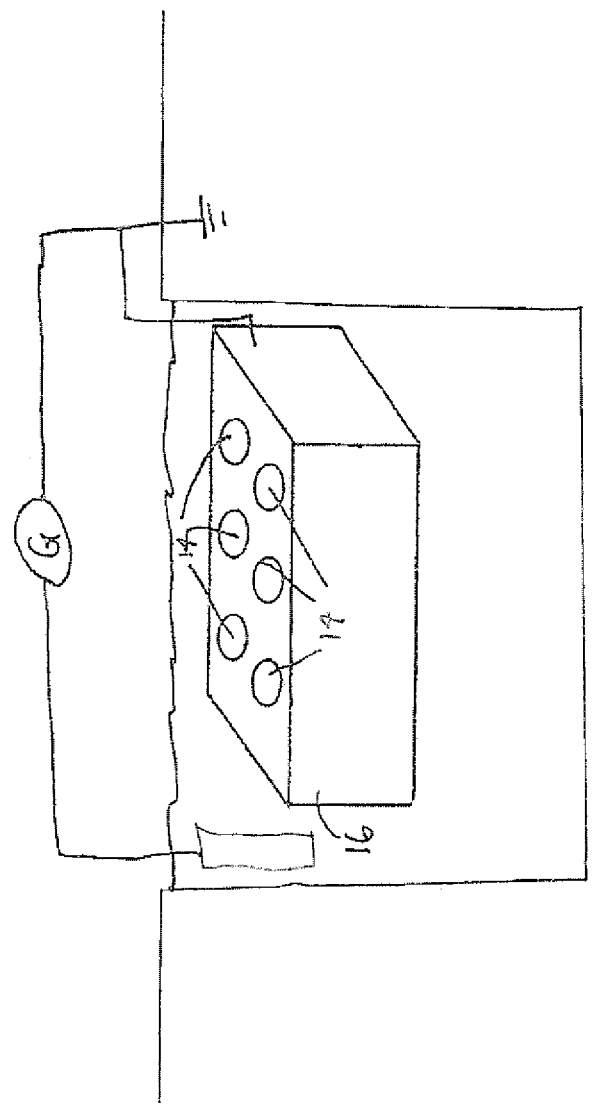
FIG. 3 is a schematic showing the template of FIG. 2 positioned in a chemical bath.

Further describing this embodiment, once the template 16 has been formed, the first set of nanowires 12 may be formed or grown in the pores or voids 14 of the template 16. In one embodiment, the growing involves vertically filling portions of the pores or voids 14 of the template 16 with an n-type material. The n-type material is CdS in one embodiment, while it is n-Si or ZnO or materials having characteristics of an n-type semiconductor, in other embodiments. Regardless, it is preferred to be electrochemically deposited, as schematically shown in FIG. 3. In one embodiment the electrochemical bath contains zinc and sulfur material. When the system is subjected to an electric current, deposition is carried out until zinc sulfide nanowires are formed to a desired length. In another embodiment for electro-depositing CdS into a template, a solution composed of 0.055M $CdCl_2$ and 0.19M elemental sulfur is used. The temperature is maintained at about 120° C. and electro-deposition occurs by applying a DC voltage (variable between about 12-30V) between a working electrode and a platinum counter electrode. Naturally, different DC voltages and deposition times are used depending on the thickness of the template and the amount of filling required. In other embodiments, however, chemical vapor deposition, evaporation, lithography, sputtering, etc. are contemplated.

After the growth of the first set of nanowires 12, at least a portion of the template 16 may be removed. In the case of an AAO template 16, a portion of the alumina may be removed by placing the template in a potassium hydroxide (KOH) or other chemical bath, such as phosphoric acid. In one embodiment, the chemical bath comprises KOH at temperature between 20-45° C. The concentration of the KOH bath can be from 0.1M to 0.4M with etching times between 20-60 minutes, depending on the length of the template to be etched. Alternatively, an ion etch or reactive ion etch could be used to partially or completely etch the template 16.

Figure 4:
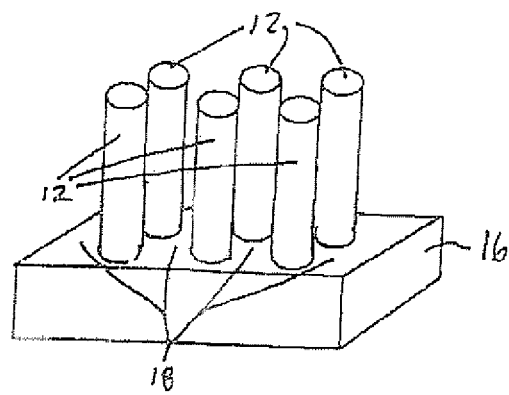
FIG. 4 is a perspective view of exposed nanowires in the template.

Selective etching of the template 16 in the chemical bath results in increased exposure of the nanowires 12 previously grown, as shown in FIG. 4. In other words, the use of the chemical bath results in removal of the template 16 and minimal, if any, removal of the nanowires 12. The resulting structure after removal of at least a portion of the template 16 is a first set of nanowires 12 with spaces 18 between the nanowires 12. One will appreciate that the first set of nanowires 12 have an ordered arrangement with the nanowires substantially parallel to one another.

Figure 5:
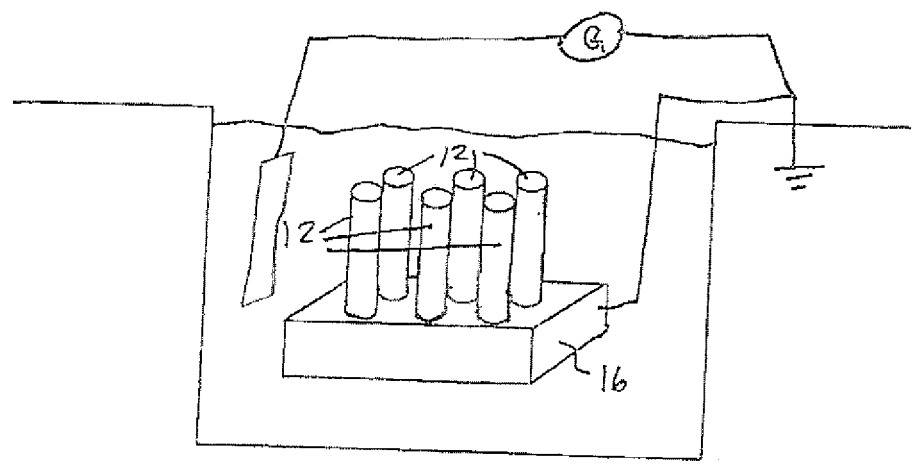
FIG. 5 is a schematic showing the workpiece of FIG. 4 positioned in a chemical bath.

At this point, a second material, such as a second set of nanowires 20, may be formed or grown in the spaces 18 between the first set of nanowires 12. In one embodiment, the second material encases the first material. The second material may be evaporated, sputtered, deposited (such as chemical vapor deposition, atomic layer deposition, or otherwise), etc. similar to the first material. For example, the second material may be an insulator, such as lithium fluoride (LiF). FIG. 5 schematically shows an arrangement for electrochemically depositing the second set of nanowires. The bath contains dissolved lithium and fluoride for ultimately forming LiF in the spaces 18. In other words, the electrochemical deposition results in the first set of nanowires 12 becoming encased in LIE One will appreciate that junctions are formed between each of the nanowires in the first set of nanowires 12 and the nanowires in the second set of nanowires 20. In particular, a vertical junction is formed between the nanowires in the first and second sets of nanowires 12, 20. Moreover, given the formation of the second set of nanowires 20 and the use of the template 16, the nanostructure 10 may be formed without any horizontal junctions between the first and second sets of nanowires 12, 20.

Figure 6:
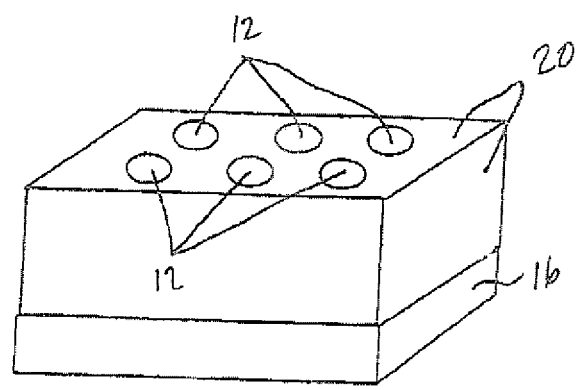
FIG. 6 is a perspective view of a workpiece with a portion of the template remaining.

After the second set of nanowires 20 have been grown or formed, the resulting workpiece can either be treated with a solution, such as KOH, to remove the rest of the template 16 or the workpiece can be subjected to a precision chemical-mechanical polish operation to remove the template 16. This results in small protrusions of nanowires 12 which can be individually contacted (FIG. 1). Alternatively, the template 16 may be left in place and used as a mechanical bonding agent to another substrate, as shown in FIG. 6.

The foregoing discussion was chosen to provide the best illustration of the principles of the invention and its practical application to thereby enable one of ordinary skill in the art to utilize the invention in various embodiments and with various modifications suited to the particular use contemplated. The nanostructure 10 disclosed herein may be used as a solar cell, for a radiation detector, or for other applications that require or would benefit from use of a nanostructure. All modifications and variations are within the scope of the invention as determined by the appended claims when interpreted in accordance with the breadth to which they are fairly, legally and equitably entitled.

What is claimed:
1. A method of fabricating a nanostructure including nanowires, comprising:
    forming an $Al_2O_3$ template having a plurality of voids in a honeycomb pattern;
    placing the template in an electrochemical bath containing zinc and sulfur;

forming a set of zinc sulfide nanowires in the plurality of voids by vertically filling said plurality of voids with zinc sulfide;

placing the template in a chemical bath to remove at least a portion of the template without removing the zinc sulfide nanowires;

placing the template in an electrochemical bath containing lithium and fluoride;

encasing the set of zinc sulfide nanowires with a set of lithium fluoride nanowires so as to form a vertical junction between said set of zinc sulfide nanowires and said set of lithium fluoride nanowires and no horizontal junctions between the set of zinc sulfide nanowires and the set of lithium fluoride nanowires; and removing any remaining portion of the template.

2. The method of claim 1, wherein the forming the set of zinc sulfide nanowires includes growing the zinc sulfide nanowires by vertically filling the plurality of voids of the template.

3. The method of claim 1, wherein the removing any remaining portion of the template exposes small protrusions of zinc sulfide nanowires which can be individually contacted.

\* \* \* \* \*